US010672549B2

(12) United States Patent
Wilson et al.

(10) Patent No.: US 10,672,549 B2
(45) Date of Patent: Jun. 2, 2020

(54) SOLENOID DIAGNOSTICS DIGITAL INTERFACE

(71) Applicant: Hamilton Sundstrand Corporation, Charlotte, NC (US)

(72) Inventors: Michael A. Wilson, Scottsdale, AZ (US); Eduardo Ahuactzin Parra, Phoenix, AZ (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 383 days.

(21) Appl. No.: 15/654,377

(22) Filed: Jul. 19, 2017

(65) Prior Publication Data

US 2019/0027290 A1 Jan. 24, 2019

(51) Int. Cl.
  *H01F 7/06* (2006.01)
  *H01H 47/32* (2006.01)
  *H03K 17/18* (2006.01)
  *H03K 17/082* (2006.01)
  *H03K 19/0175* (2006.01)
  *G05F 1/10* (2006.01)

(52) U.S. Cl.
  CPC ............. *H01F 7/064* (2013.01); *H01H 47/32* (2013.01); *H03K 17/0826* (2013.01); *H03K 17/18* (2013.01); *H03K 19/017509* (2013.01); *G05F 1/10* (2013.01)

(58) Field of Classification Search
  CPC ......... H01H 47/22; H01H 47/32; H01F 7/064
  See application file for complete search history.

(56) References Cited

U.S. PATENT DOCUMENTS 4,736,267 A 4/1988 Karlmann
4,932,246 A 6/1990 Deutsch
(Continued)

FOREIGN PATENT DOCUMENTS

| CA | 2746803 A1 | 1/2013 |
| EP | 0817381 A2 | 1/1998 |
| WO | 2014060787 A1 | 4/2014 |

OTHER PUBLICATIONS

Search Report for European Application No. 18184478.8; Application Filing Date Jul. 19, 2018; dated Nov. 21, 2018 (10 pages).

*Primary Examiner* — Thienvu V Tran
*Assistant Examiner* — Christopher J Clark
(74) *Attorney, Agent, or Firm* — Cantor Colburn LLP

(57) ABSTRACT

A solenoid electrical diagnostic system includes a solenoid circuit operable in response to an electrical current. A low-side switch includes a low-side input configured to receive a pulsed voltage signal and a low-side output in signal communication with the solenoid circuit. The low-side switch continuously switches between an on-state and an off-state based on the pulsed voltage signal to adjust a level of the current flowing through the solenoid circuit. A solenoid monitoring unit generates a low-side output state signal based on an output voltage at the low-side output, and a low-side input state signal based on an input voltage at the low-side input. The solenoid electrical diagnostic system further includes an electronic hardware controller determines at least one operating condition of the solenoid circuit based on a comparison between the state signals and a threshold value.

19 Claims, 3 Drawing Sheets

(56) References Cited

U.S. PATENT DOCUMENTS

| | | | |
|---|---|---|---|
| 5,119,683 A * | 6/1992 | Deutsch | G05D 7/0635 |
| | | | 73/861 |
| 5,621,603 A | 4/1997 | Adamec | |
| 5,986,484 A * | 11/1999 | Kimata | H03K 17/0828 |
| | | | 323/908 |
| 6,307,376 B1 | 10/2001 | Alexander | |
| 6,943,540 B2 | 9/2005 | Vincent | |
| 7,054,772 B2 | 5/2006 | Iannone | |
| 7,609,069 B2 | 10/2009 | Berg | |
| 8,055,460 B2 | 11/2011 | Rajagopalan | |
| 8,403,649 B2 | 3/2013 | Sanger | |
| 8,687,333 B2 * | 4/2014 | Gosse | H02H 1/04 |
| | | | 361/87 |
| 9,528,625 B2 | 12/2016 | Schweikert | |
| 10,424,452 B2 * | 9/2019 | Matsuo | H01F 7/1844 |
| 2010/0315091 A1 * | 12/2010 | Hartlieb | H02M 1/32 |
| | | | 324/509 |
| 2013/0128408 A1 * | 5/2013 | Giacobbe | H01H 47/10 |
| | | | 361/160 |
| 2015/0303805 A1 * | 10/2015 | Franchini | B60T 8/885 |
| | | | 323/271 |
| 2018/0323776 A1 * | 11/2018 | Bange | H03K 17/0822 |

\* cited by examiner

SOLENOID DIAGNOSTICS DIGITAL INTERFACE

BACKGROUND

Various non-limiting embodiments relate generally to aircraft vehicles, and more particularly, to aircraft hydraulic systems.

Aircraft vehicles flight controls are operated primarily according to hydraulic systems. These hydraulic flight control systems can be selectively enabled or disabled using an electromechanical switch such as, for example, a solenoid valve. Health monitoring regulations may require monitoring and diagnosing the operating conditions of these solenoid valves. For instance, an electronic diagnostic system may be required to detect circuit fault conditions affecting the solenoid valve such as, for example, open circuits, short circuits, etc.

Conventional electronic diagnostic systems employ an analog-to-digital converter (ADC), which includes complex electrical circuitry and components to convert the electrical current flowing through the solenoid valve into a digital signal. The converted digital signal is then utilized by an electronic hardware controller to detect the circuit fault. However, implementing an ADC in the diagnostic systems increases costs, and also requires that the diagnostic circuit includes one or more signal channels dedicated to the ADC.

BRIEF DESCRIPTION

Disclosed is a solenoid electrical diagnostic system includes a solenoid circuit operable in response to an electrical current. A low-side switch includes a low-side input configured to receive a pulsed voltage signal and a low-side output in signal communication with the solenoid circuit. The low-side switch continuously switches between an on-state and an off-state based on the pulsed voltage signal to adjust a level of the current flowing through the solenoid circuit. A solenoid monitoring unit generates a low-side output state signal based on an output voltage at the low-side output, and a low-side input state signal based on an input voltage at the low-side input. The solenoid electrical diagnostic system further includes an electronic hardware controller determines at least one operating condition of the solenoid circuit based on a comparison between the state signals and a threshold value.

Also disclosed is an electronic solenoid monitoring unit configured to determine an operating condition of a solenoid circuit. The electronic solenoid monitoring unit includes a first state detection circuit and a second state detection circuit. The first state detection circuit is in signal communication with a low-side output of the solenoid circuit. The first state detection circuit is configured to determine a low-side output state signal. The second state detection circuit in signal communication with a low-side input of a low-side switch that controls an electrical current through the solenoid circuit, the second state detection circuit configured to determine a low-side input state signal. A first voltage level of the low-side output state signal is indicative of a first duty cycle at the low-side output. A second voltage level of the low-side input state signal is indicative of a second duty cycle at the low-side input. The first and second duty cycles indicate the operating condition of the solenoid circuit.

According to another embodiment, a method of diagnosing a solenoid circuit is disclosed. The method includes operating a solenoid circuit in response to driving an electrical current therethrough, and delivering a pulsed voltage signal to a low-side switch to continuously switch the low-side switch between an on-state and an off-state to adjust a level of the current flowing through the solenoid circuit. The method further includes generating a low-side output state signal based on an output voltage at the low-side output, via a solenoid monitoring unit. The method further includes generating, via the solenoid monitoring unit, a low-side input state signal based on an input voltage at the low-side input. The method further includes determining, via an electronic hardware controller, at least one operating condition of the solenoid circuit based on a comparison between the state signals and a threshold value.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various non-limiting embodiments described herein provide an electrical diagnostic system including a digital interface configured to monitor the operating condition of an electromechanical switch. In one or more embodiments, the electromechanical switch includes a low-side switching solenoid drive circuit that regulates a solenoid drive current flowing through a solenoid load using a pulse width modulation (PWM) circuit. The solenoid electrical diagnostic system provides a digital interface configured to generate digital signals corresponding to the state of the low-side switching solenoid drive circuit and low-side load voltage, without requiring an ADC. The digital signals can then be delivered to an electronic hardware controller which determines the operating condition of the solenoid valve.

In at least one embodiment, different duty cycle thresholds are assigned an operating condition, e.g., a normal operating condition (e.g., no fault condition), an open fault condition, and a short circuit fault condition. In this manner, a normal operating condition, open fault condition and/or a short circuit fault condition of the solenoid valve can be determined by comparing the digital signals generated by the to the digital signals to the individual duty cycle thresholds.

Figure 1:
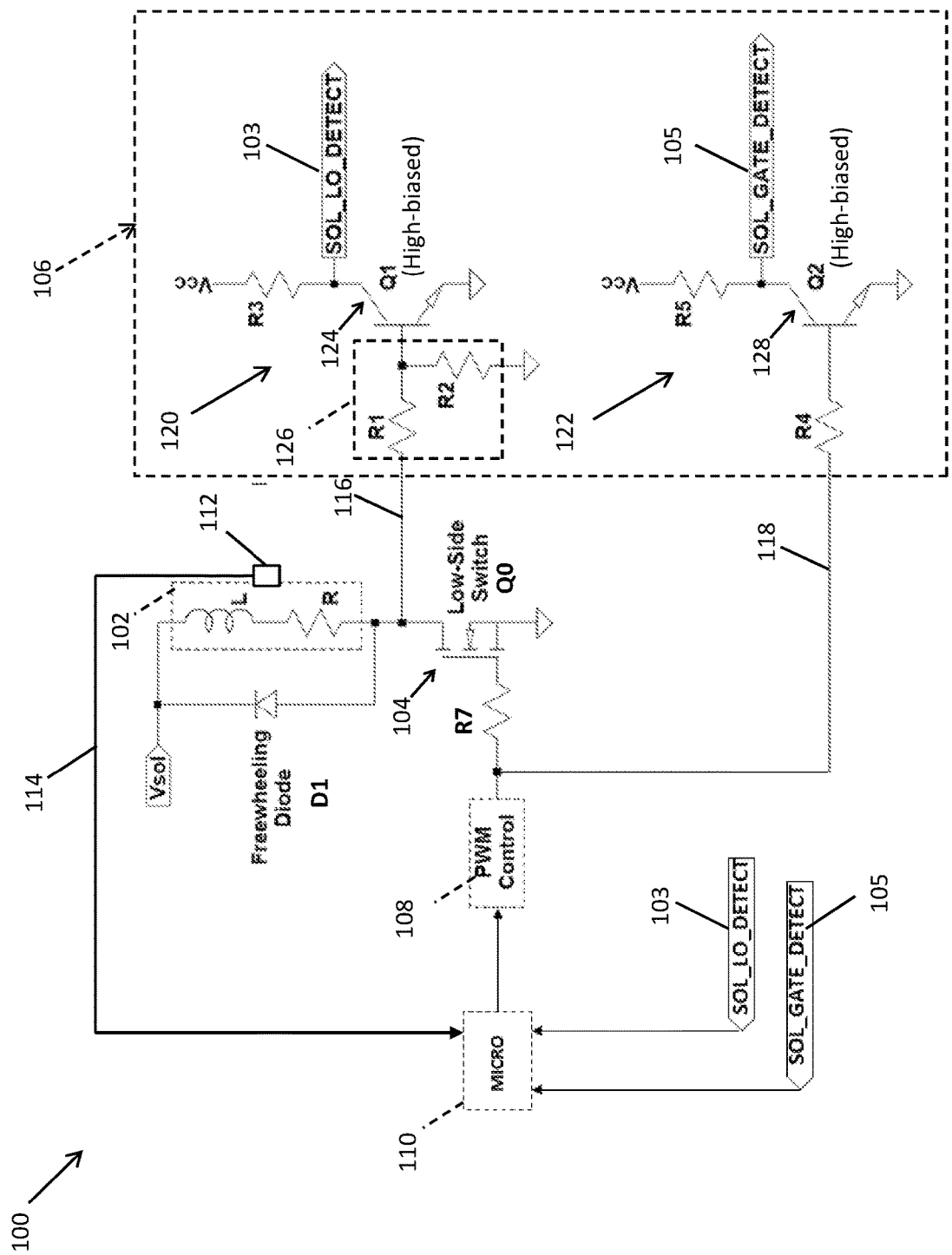
FIG. 1 is a schematic diagram of a solenoid electrical diagnostic system according to a non-limiting embodiment.

Turning now to FIG. 1, a solenoid electrical diagnostic system 100 is illustrated according to a non-limiting embodiment. The solenoid electrical diagnostic system 100 includes an electromechanical switch 102, a low-side switch 104, an electronic monitoring circuit 106, a pulse width modulation (PWM) circuit 108, and an electronic hardware controller 110.

The electromechanical switch 102 includes, for example, a solenoid circuit 102 that is operable in response to an electrical current. The solenoid circuit 102 includes a load inductor (L) connected in series with a load resistor (R) to define a solenoid load. The load inductor (L) has a first terminal connected to an input power supply (Vcc) and an opposing second terminal connected to a first end of the load resistor (R). The second end of the load resistor (L) is connected to a low-side output of the low-side switch 104.

The solenoid circuit further includes a free-wheeling diode (D1) and a current sensor 112. The free-wheeling diode (D1) includes a cathode commonly connected to the first terminal of the load inductor (L) and the input power supply (Vcc), and an anode commonly connected with the second end of the load resistor (R) and the low-side output of the low-side switch 102. In this manner, the free-wheeling diode (D1) can serve to protect one or more components such as the low-side switch 104, for example, from damage during voltage transient events.

The current sensor 112 measures the level of the drive current flowing through series RL circuit. The current sensor 112 is in signal communication with the controller 110 and outputs a current feedback signal 114 indicative of the level of the current flowing through the solenoid circuit 102 (i.e., the solenoid load).

The low-side switch 104 includes a low-side input configured to receive a pulsed voltage signal generated by the PWM circuit 108. The low-side switch 104 is continuously switched between an on-state and an off-state according to the duty cycle ($D_{PWM}$) of the pulsed output signal. The duty cycle of the low-side switch 104 regulates the drive current through the solenoid circuit 102. For instance, drive current through the solenoid circuit 102 is promoted when the low-side switch 104 is driven at higher duty cycles, while drive current through the solenoid circuit 102 is inhibited when the low-side switch 104 is driven at lower duty cycles (i.e., closer to zero %). Accordingly, the PWM circuit 108 can be controlled to vary the duty cycle of the pulsed output signal thereby regulating the drive current through the solenoid circuit 102.

In at least one non-limiting embodiment, the low-side switch 104 is configured as a metal oxide field effect transistor (MOSFET) that includes a gate terminal, a drain terminal, and a source terminal. The gate terminal is connected to a first end of a gate resistor (R7). The second end of the gate resistor (R7) is connected to the output of the PWM circuit 108 so as deliver the pulsed voltage signal to the gate terminal of the low-side switch 104. The source terminal is connected to a ground potential. The drain terminal is connected to the second end of the load resistor to define the low-side output of the low-side switch.

The solenoid monitoring unit 106 is in signal communication with the low-side switch 104 and the controller 110, and is configured to generate a pair of electrical state signals corresponding to the low-side switch 102. In at least one embodiment, the solenoid monitoring unit 106 generates a low-side output electrical state signal 103 (e.g., SOL_LO_DETECT) and a low-side input electrical state signal 105 (e.g., SOL_GATE_DETECT). The low-side output state signal is generated based on an output voltage at the low-side output of the low-side switch 104. The low-side input state signal 103 is generated based on an input voltage at the low-side input of the low-side switch 104. In at least one non-limiting embodiment, the low-side output signal state signal 103 is high and the low-side input electrical state signal 105 is low when the PWM control output 108 is high. When the output of the PWM circuit 108 is low, the low-side output signal state signal 103 is low and the low-side input electrical state signal 105 is high. The controller 110 is configured to determine the operating condition of the solenoid circuit 102 based on a comparison between the electrical state signals 103 and 105, and a threshold value as described in greater detail below.

The solenoid monitoring unit 106 includes a first input terminal 116 and a second input terminal 118. The first input terminal 116 includes a first end in signal communication with the low-side output of the low-side switch 104 the second end of the load resistor (R). The opposing second end of the first input terminal 116 is in signal communication with a first state detection circuit 120. The second input terminal 118 includes a first end in signal communication with the output of the PWM circuit 108 and the second end of the gate resistor R7. The opposing second end of the second terminal is in signal communication with a second state detection circuit 122.

The first state detection circuit 120 determines the low-side output state signal 103. The first state detection circuit 120 includes a first semiconductor switch 124, a voltage divider circuit 126, and a first pull-up resistor (R3). In at least one embodiment, the first semiconductor switch 124 is constructed as a bipolar junction transistor (BJT) having a base terminal, a collector terminal, and an emitter terminal. The base terminal is connected to an output of the voltage divider circuit 126. The collector terminal is connected to a ground reference point. The emitter terminal is connected to a first end of the first pull-up resistor (R3). The opposing second end of the pull-up resistor (R3) is connected to the input voltage supply (Vcc).

The voltage divider circuit 126 includes a first resistor (R1) and a second resistor (R2). A first end of the first resistor (R1) is connected to the low-end output of the low-side switch 104. The opposing second of the first resistor (R1) is connected to a first end of the second resistor (R2). The node defined by the connection of the first resistor (R1) and the second resistor (R2) establishes the output of the voltage divider circuit 126. In this manner, the voltage divider circuit 126 serves to reduce the voltage present at the base terminal of the first semiconductor switch 124.

The second state detection circuit 122 determines the low-side input state signal 105. The second state detection circuit 122 includes a second semiconductor switch 128, a base resistor (R4), and a second pull-up resistor (R5). In at least one embodiment, the second semiconductor switch 128 is constructed as a bipolar junction transistor (BJT) having a base terminal, a collector terminal, and an emitter terminal. The base terminal connected to a first end of the base resistor (R4), while the opposing second end of the base resistor (R4) is commonly connected to the output of the PWM circuit 108 and the second end of the gate resistor (R7). The emitter terminal is connected to a ground reference point.

The collector terminal is connected to a first end of the second pull-up resistor (R5). The opposing second end of the second pull-up resistor (R5) is connected to the input power supply (Vcc).

The controller 110 is in signal communication with the PWM circuit 108 and the output of the current sensor 112. The controller 110 is capable of commanding the PWM circuit 108 to control the duty cycle of the pulsed voltage signal based on the current feedback signal 114. More specifically, the duty cycle of the low-side switch 104 regulates the drive current through the solenoid circuit 102. Accordingly, the drive current through the solenoid circuit 102 can be promoted when the low-side switch 104 is driven at higher duty cycles, while the drive current through the solenoid circuit 102 can be inhibited when the low-side switch 104 is driven at lower duty cycles (i.e., closer to zero %). Accordingly, the controller 110 can command the PWM circuit 108 to vary the duty cycle of the pulsed output signal generated by the PWM circuit 108 thereby regulating the drive current through the solenoid circuit 202.

The controller 110 is further configured to determine an operating condition of the solenoid circuit 102 based on a first comparison between the low-side output state signal 103 generated by the first state detection circuit 120 and at least one low-side output threshold, and a second comparison between the low-side input state signal 105 generated by the second state detection circuit 122 and at least one low-side input threshold.

In at least one non-limiting embodiment, the at least one low-side output threshold includes a first output threshold assigned to a first operating condition (e.g., a short-circuit fault condition), a second output threshold assigned to a second operating condition (e.g., an open-circuit fault condition), and a third output threshold assigned to a third operating condition (e.g., a normal operating condition). The normal operating condition can be referred to as an operating condition that excludes faults such as, for example, the short-circuit fault condition and the open-circuit fault condition. In at least one non-limiting embodiment, the output thresholds are duty cycle thresholds.

Similarly, the at least one low-side input threshold includes a first input threshold assigned to the first operating condition (e.g., the short circuit condition), a second input threshold assigned to the second operating condition (e.g., the open-circuit condition), and a third input threshold assigned to the third operating condition (e.g., the normal operating condition). The first input threshold is different from the first output threshold, the second input threshold is different from the second output threshold, and the third input threshold is different from the third output threshold. In at least one non-limiting embodiment, the output thresholds are duty cycle thresholds. Examples of the various duty cycle thresholds are represented in the table presented below:

TABLE 1

| Load Status | SOL_GATE_DETECT Duty Cycle | SOL_LO_DETECT Duty Cycle |
| --- | --- | --- |
| No fault | <90% | >10% |
| Short Circuit | >90% | 0% |
| Open Circuit | <5% | 100% |

During normal operating conditions, e.g., when the solenoid circuit 102 is experiencing no faults and it has reached steady-state current conditions, the low-side output state signal 103 generated by the first state detection circuit 120 has a duty cycle ($D_{C1}$) equal to, or approximately equal to, the duty cycle ($D_{PWM}$) of the pulsed voltage signal which regulates the target current level driving the solenoid circuit 102. In addition, the low-side input state signal 105 generated by the second state detection circuit 122 has a complementary duty cycle ($D_{C2}$) which can be determined as differential with respect to the pulsed voltage signal (i.e., $1-D_{PWM}$).

Figure 2:
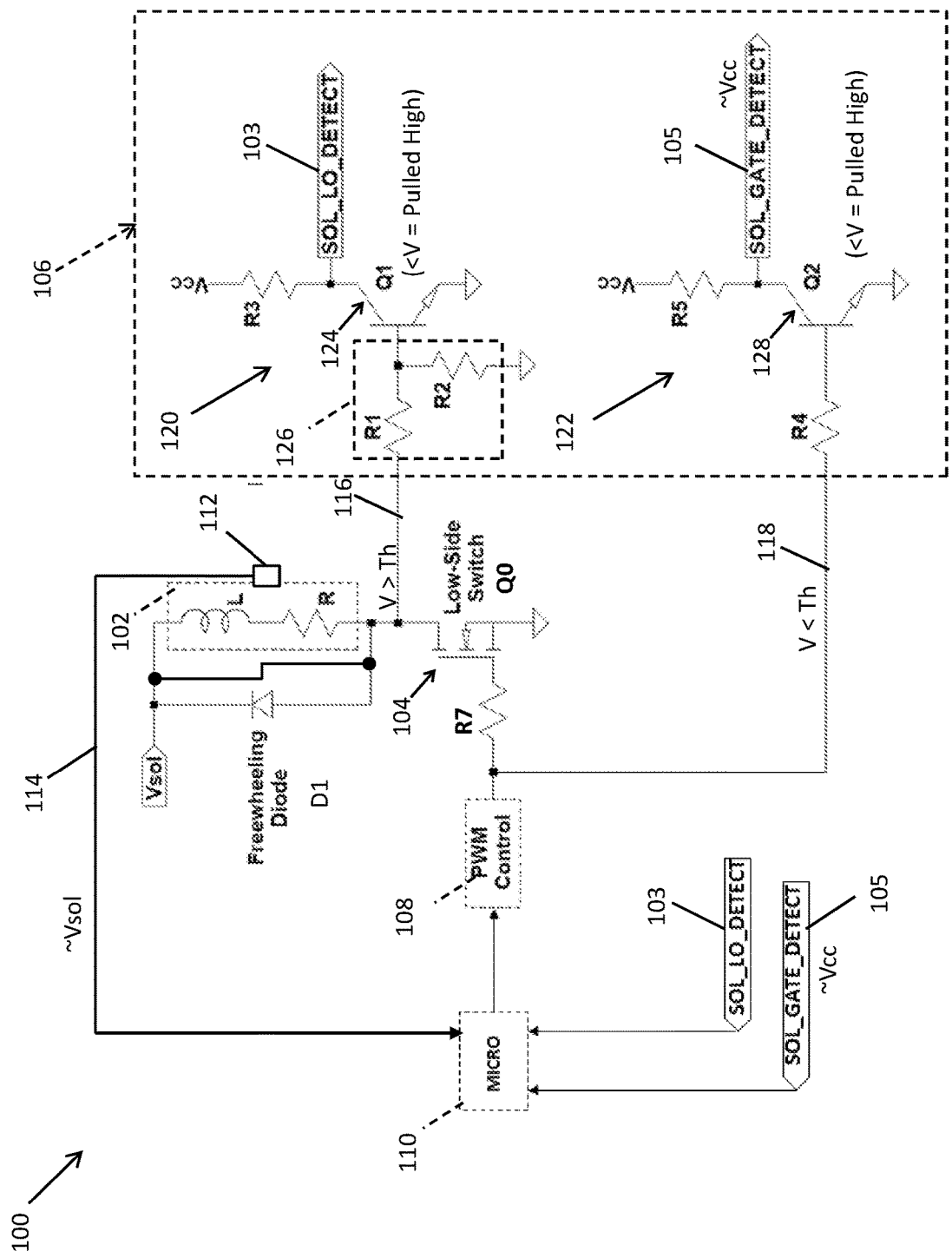
FIG. 2 is a schematic diagram illustrating the solenoid electrical diagnostic system during a short-circuit condition according to a non-limiting embodiment.

When a short-circuit fault condition occurs (see FIG. 2), however, the current sensor 112 will output a current level value that appears to meet the target drive current set point due to the lacking inductance of the load inductor (L). As a result, the controller 110 will falsely believe the target drive current has been reached, and will command the PWM circuit 108 to generate the pulsed voltage signal at a very low duty cycle, e.g., less than 5%. Therefore, the low-side output state signal 103 generated by the first state detection circuit 120 will indicate a very low duty cycle (e.g., less than 5%), while the low-side input signal generated by the second state detection circuit 122 will indicate a very high duty cycle, e.g., about 90% or greater.

Figure 3:
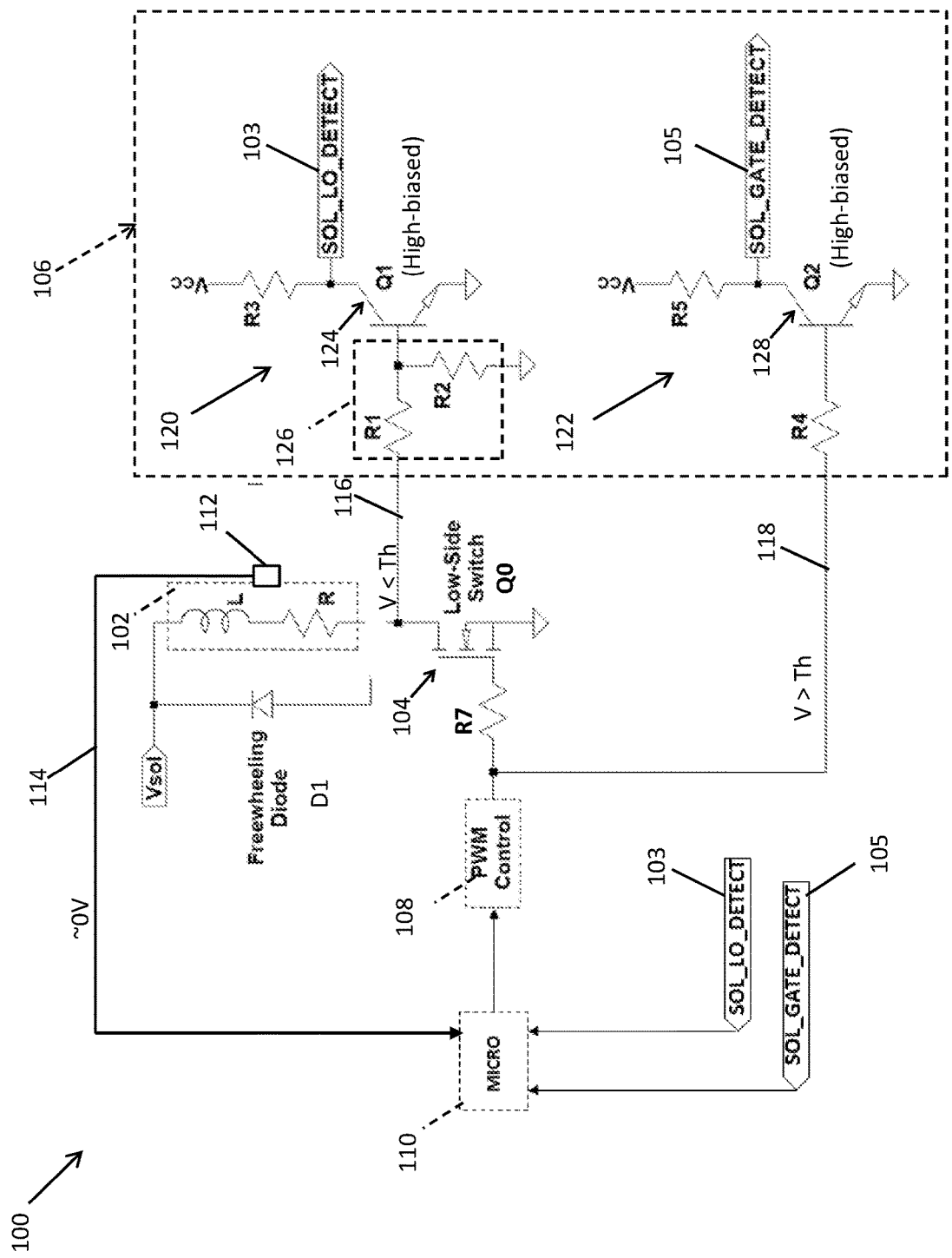
FIG. 3 is a schematic diagram illustrating the solenoid electrical diagnostic system during an open-circuit condition according to a non-limiting embodiment.

When an open-circuit fault condition occurs (see FIG. 3), the current sensor 112 will output a current level of 0 amps, or approximately 0 amps due to the open circuit between the second end of the load resistor (R) and the low-side output of the low-side switch 102. Accordingly, the controller 110 will falsely believe that the drive current is well below the target drive current setpoint. As a result, the controller 110 will command the PWM circuit 108 to generate the pulsed voltage signal with a very high duty cycle (DPWM). In turn, the high duty cycle (DPWM) of the pulsed voltage signal causes the second state detection circuit 122 indicate very high duty cycle at the low-side input via the low-side input state signal 105.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A solenoid electrical diagnostic system comprising:
   a solenoid circuit operable in response to an electrical current;
   a low-side switch including a low-side input configured to receive a pulsed voltage signal and a low-side output in operable communication with the solenoid circuit, the low-side switch configured to continuously switch between an on-state and an off-state based on the pulsed voltage signal to adjust a level of the current flowing through the solenoid circuit; and
   a solenoid monitoring unit in operable communication with the low-side switch, and configured to generate a low-side output state signal based on an output voltage at the low-side output, and to generate a low-side input state signal based on an input voltage at the low-side input; and
   an electronic hardware controller in operable communication with the solenoid monitoring unit, and configured to determine at least one operating condition of the solenoid circuit based on a comparison between the state signals and at least one threshold value,
wherein the solenoid monitoring unit includes a first state detection circuit having a first input in operable communication with the low-side output to receive the output voltage at the low-side output, and a second state detection circuit having a second input in operable communication with the low-side input to receive the input voltage at the low-side input.

2. The solenoid electrical diagnostic system of claim 1, wherein the first state detection circuit determines the low-side output state signal and the second state detection circuit determines the low-side input state signal.

3. The solenoid electrical diagnostic system of claim 2, wherein the low-side output state signal has a first voltage level corresponding to a logic high value, and the low-side input state signal has a second voltage level corresponding to a logic low value when the pulsed voltage signal has a first duty cycle.

4. The solenoid electrical diagnostic system of claim 3, wherein the low-side output signal state signal has a first voltage level corresponding to a logic low value, and the low-side input state signal has a second voltage level corresponding to a logic high value when the pulsed voltage signal has a second duty cycle greater than the first duty cycle.

5. The solenoid electrical diagnostic system of claim 4, wherein:
the first state detection circuit comprises:
a first semiconductor switch having a first base terminal connected to an output of a voltage divider circuit, a first collector terminal connected to a first end of a first pull-up resistor, and a first emitter terminal connected to a ground reference point; and
the second state detection circuit comprises:
a second semiconductor switch having a second base terminal connected to a first end of a gate resistor, a second collector terminal connected to a first end of a second pull-up resistor, and a second emitter terminal connected to a ground reference point.

6. The solenoid electrical diagnostic system of claim 4, further comprising a current sensor configured to output a current feedback signal indicative of the level of the current flowing through the solenoid circuit.

7. The solenoid electrical diagnostic system of claim 6, wherein the controller is in operable communication with the current sensor and a PWM circuit, the controller configured to output a PWM control signal that commands the PWM circuit to adjust a duty cycle of the pulsed voltage signal based on the current feedback signal.

8. The solenoid electrical diagnostic system of claim 4, wherein the controller is further configured to determine the at least one operating condition of the solenoid circuit based on a first comparison between the low-side output state signal and at least one low-side output threshold, and a second comparison between the low-side input state signal and at least one low-side input threshold.

9. The solenoid electrical diagnostic system of claim 8, wherein the at least one low-side output threshold includes a first output threshold assigned to a first operating condition, a second output threshold assigned to a second operating condition different from the first operating condition, and a third output threshold assigned to a third operating condition different from the first and second operating conditions.

10. The solenoid electrical diagnostic system of claim 9, wherein the at least one low-side input threshold includes a first input threshold assigned to the first operating condition, a second input threshold assigned to the second operating condition, and a third input threshold assigned to the third operating condition, the first input threshold different from the first output threshold, the second input threshold different from the second output threshold, and the third input threshold different from the third output threshold.

11. The solenoid electrical diagnostic system of claim 10, wherein the first operating condition is a short-circuit operating condition, the second operating condition is an open-circuit operating condition and the third operating condition is a normal operating condition excluding the short-circuit condition and the open-circuit operating condition.

12. An electronic solenoid monitoring unit configured to determine an operating condition of a solenoid circuit, the electronic solenoid monitoring unit comprising:
a first state detection circuit configured to generate a low-side output state signal in operable communication with a low-side output of the solenoid circuit to receive an output voltage at the low-side output; and
a second state detection circuit configured to generate a low-side input signal in operable communication with a low-side input of a low-side switch that controls an electrical current through the solenoid circuit, the second state detection circuit to receive an input voltage at the low-side input,
wherein a first voltage level of the low-side output state signal is indicative of a first duty cycle at the low-side output and a second voltage level of the low-side input state signal is indicative of a second duty cycle at the low-side input, the first and second duty cycles indicating the operating condition of the solenoid circuit.

13. The electronic solenoid monitoring unit of claim 12, wherein the low-side output electrical state signal has a first voltage level corresponding to a logic high value and the low-side input electrical state signal has a second voltage level corresponding to a logic low value when a pulsed voltage signal used to control the low-side switch has a first duty cycle.

14. The electronic solenoid monitoring unit of claim 13, wherein the low-side output signal state signal has a first voltage level corresponding to a logic low value and the low-side input state signal has a second voltage level corresponding to a logic high value when the pulsed voltage signal has a second duty cycle greater than the first duty cycle.

15. The electronic solenoid monitoring unit of claim 14, wherein:
the first state detection circuit comprises:
a first semiconductor switch having a first base terminal connected to an output of a voltage divider circuit, a first collector terminal connected to a first end of a first pull-up resistor, and a first emitter terminal connected to a ground reference point; and
the second state detection circuit comprises:
a second semiconductor switch having a second base terminal connected to a first end of a gate resistor, a second collector terminal connected to a first end of a second pull-up resistor, and a second emitter terminal connected to a ground reference point.

16. A method of diagnosing a solenoid circuit, the method comprising:
operating a solenoid circuit in response to driving an electrical current therethrough;

delivering a pulsed voltage signal to a low-side switch to continuously switch the low-side switch between an on-state and an off-state to adjust a level of the current flowing through the solenoid circuit; and generating a low-side output state signal based on an output voltage at a low-side output of the low-side switch, via a solenoid monitoring unit;

generating, via the solenoid monitoring unit, a low-side input state signal based on an input voltage at the low-side input;

determining, via an electronic hardware controller, at least one operating condition of the solenoid circuit based on a comparison between the state signals and at least one threshold value;

wherein the solenoid monitoring unit includes a first state detection circuit having a first input in operable communication with the low-side output to receive the output voltage at the low-side output, and a second state detection circuit having a second input in operable communication with the low-side input to receive the input voltage at the low-side input.

17. The method of claim 16, further comprising determining, via the first state detection circuit included in the solenoid monitoring unit, the low-side output state signal, and determining, via the second state detection circuit included in the solenoid monitoring unit, the low-side input state signal.

18. The method of claim 17, further comprising determining, via the controller, the at least one operating condition of the solenoid circuit based on a first comparison between the low-side output state signal and at least one low-side output threshold, and a second comparison between the low-side input state signal and at least one low-side input threshold.

19. The method of claim 18, wherein the at least one low-side output threshold includes a first plurality of different duty cycles assigned to different operating conditions, and the at least one low-side input threshold includes a second plurality of different duty cycles assigned to different operating conditions.

* * * * *